United States Patent
Kamei (10) Patent No.: US 10,955,350 B2
(45) Date of Patent: Mar. 23, 2021

(54) SIC WAFER DEFECT MEASURING METHOD, REFERENCE SAMPLE, AND METHOD OF MANUFACTURING SIC EPITAXIAL WAFER

(71) Applicant: SHOWA DENKO K.K., Tokyo (JP)

(72) Inventor: Koji Kamei, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 16/471,370

(22) PCT Filed: Dec. 7, 2017

(86) PCT No.: PCT/JP2017/044093
§ 371 (c)(1),
(2) Date: Jun. 19, 2019

(87) PCT Pub. No.: WO2018/123506
PCT Pub. Date: Jul. 5, 2018

(65) Prior Publication Data
US 2019/0331603 A1    Oct. 31, 2019

(30) Foreign Application Priority Data
Dec. 28, 2016    (JP) .............................. JP2016-255628

(51) Int. Cl.
*C30B 25/04* (2006.01)
*G01N 21/64* (2006.01)
(Continued)

(52) U.S. Cl.
CPC .......... *G01N 21/6489* (2013.01); *C30B 25/04* (2013.01); *C30B 29/06* (2013.01);
(Continued)

(58) Field of Classification Search
CPC .......... H01L 21/02529; H01L 21/67288; C30B 25/04; C30B 29/06; C30B 29/36; G01N 21/6489; G01N 21/9501; G01N 21/95607
See application file for complete search history.

(56) References Cited

U.S. PATENT DOCUMENTS

| | | | |
|---|---|---|---|
| 6,639,249 B2 * | 10/2003 | Valliath | H01L 27/156 257/88 |
| 2011/0249112 A1 * | 10/2011 | Endo | G01N 21/956 348/92 |
| 2015/0168311 A1 | 6/2015 | Seki et al. | |

FOREIGN PATENT DOCUMENTS

| JP | 2007-318031 A | 12/2007 |
|---|---|---|
| JP | 2009-008396 A | 1/2009 |

(Continued)

OTHER PUBLICATIONS

J. Hassan, et al., "Characterization of the carrot defect in 4H-SiC epitaxial layers", Journal of Crystal Growth, 2010, pp. 1828-1837, vol. 312.

(Continued)

*Primary Examiner* — David P Porta
*Assistant Examiner* — Fani Boosalis
(74) *Attorney, Agent, or Firm* — Sughrue Mion, PLLC (57) ABSTRACT

A SiC wafer defect measuring method which includes a device management step of managing a defect measuring device by irradiating a reference sample made of a material having a light-emitting intensity that does not change with repeated irradiation by excitation light and which has a pattern made of recesses and/or protrusions in the surface, the irradiation by the excitation light being performed before measuring defects in a SiC wafer and under the same irradiation conditions as the measurement of the defects in (Continued)

the SiC wafer, and then measuring the S/N ratio of the pattern from a reflection image of the pattern.

13 Claims, 6 Drawing Sheets

(51) Int. Cl.
    *C30B 29/06*     (2006.01)
    *C30B 29/36*     (2006.01)
    *G01N 21/95*     (2006.01)
    *G01N 21/956*     (2006.01)
    *H01L 21/02*     (2006.01)
    *H01L 21/67*     (2006.01)

(52) U.S. Cl.
    CPC ......... *C30B 29/36* (2013.01); *G01N 21/9501* (2013.01); *G01N 21/95607* (2013.01); *H01L 21/02529* (2013.01); *H01L 21/67288* (2013.01)

(56) References Cited

FOREIGN PATENT DOCUMENTS

| JP | 2012-160655 A | 8/2012 |
| JP | 2013-023399 A | 2/2013 |
| JP | 2015-119056 A | 6/2015 |
| JP | 2016-058499 A | 4/2016 |
| JP | 2016-121059 A | 7/2016 |

OTHER PUBLICATIONS

C. Hallin, et al., "The origin of 3C polytype inclusions in epitaxial layers of silicon carbide grown by chemical vapour deposition", Diamond and Related Materials, 1997, pp. 1297-1300, vol. 6.
International Search Report for PCT/JP2017/044093 dated Feb. 27, 2018 [PCT/ISA/210].
Communication dated Oct. 13, 2020, issued by the Japanese Patent Office in application No. 2016-255628.

* cited by examiner

SIC WAFER DEFECT MEASURING METHOD, REFERENCE SAMPLE, AND METHOD OF MANUFACTURING SIC EPITAXIAL WAFER

TECHNICAL FIELD

The present invention relates to a SiC wafer defect measuring method, a reference sample, and a method of manufacturing a SiC epitaxial wafer.

This application is a National Stage of International Application No. PCT/JP2017/044093, filed on Dec. 7, 2017, which claims priority from Japanese Patent Application No. 2016-255628, filed Dec. 28, 2016, the contents of which are incorporated herein by reference.

BACKGROUND ART

Silicon carbide (SiC) has a dielectric breakdown electric field that is an order of magnitude larger than that of silicon (Si), a band gap that is three times as wide, and further, because of characteristics that include a thermal conductivity that is about three times higher, silicon carbide holds much promise for applications to power devices, high-frequency devices, and high-temperature operation devices and the like.

The development of high-quality crystal growth techniques and high-quality epitaxial growth techniques is essential for accelerating the implementation of SIC devices.

SiC devices are generally produced using a SiC epitaxial wafer, in which SiC epitaxial layer (film) that acts as an active region of the device is grown by chemical vapor deposition (CVD) or the like on a SiC single crystal substrate obtained by processing a bulk single crystal of SiC grown by the sublimation recrystallization method or the like.

More specifically, SiC epitaxial wafers generally have a 4H SiC epitaxial lay grown by step flow growth (lateral growth from an atomic step) on a SIC single crystal substrate, in which a surface having an off-angle in the <11–20> direction from the (0001) plane acts as the growth surface.

Known types of defects found in the epitaxial layer of SiC epitaxial wafers include defects that are propagated from defects in the SIC single crystal substrate, and defects that are newly formed inside the epitaxial layer. Threading dislocations, basal plane dislocations, and carrot defects are known examples of the former, while triangular defects and the like a known examples of the latter.

For example, although carrot defects are long, rod-shaped defects in the step flow growth direction when viewed from the epi surface side, they are believed to be originally formed at substrate dislocations (threading screw dislocations (TSD) or basal plane dislocations (BPD)) or scratches on the substrate (see Non-Patent Document 1).

Further, although triangular defects are formed along the step flow growth direction (<11–20> direction) and oriented facing a direction in which the apex of the triangle and the opposite side (base) are sequentially arranged from the upstream side toward the downstream side, they are believed to originate at the time action of the SiC epitaxial wafer from contaminants (downfall) being present on the SiC single crystal substrate before epitaxial growth or inside the epitaxial layer during epitaxial growth, with the defects then becoming exposed on the epi surface as a result of the subsequent extension of a 3C polymorphous layer along the off-angle of the substrate (see Non-Patent Document 2).

It is known that intrinsic defects in SiC single crystal substrates and SiC epitaxial wafers (these are sometimes collectively referred to as "SiC wafers" below) can be detected by the photoluminescence method (for example, see Patent Documents 3 and 4).

In defect detection methods using the photoluminescence method, an excitation light is irradiated that has an energy greater than the band gap of SiC. Consequently, excitation of the electrons in the SiC wafer results in the generation of holes, and light is emitted when those electrons and holes recombine. Because the characteristics of the emitted light are different depending on the type of defect, the presence of a variety of defects has been determined by measuring the emitted light.

In order to evaluate and ensure the quality of SiC wafers, classification and quantitative counting of defects by type is becoming increasingly sought. At that time, management of a device using a reference sample is desirable for ensuring measurement accuracy.

PRIOR ART LITERATURE

Patent Documents

Patent Document 1: Japanese Unexamined Patent Application, First Publication No. 2013-023399
Patent Document 2: Japanese Unexamined Patent Application, First Publication No. 2016-058499
Patent Document 3: Japanese Unexamined Patent Application, First Publication No. 2016-121059
Patent Document 4: Japanese Unexamined Patent Application, First Publication No. 2012-160655

Non-Patent Documents

Non-Patent Document 1: J. Hassan et al., Journal of Crystal Growth, 312 (2010), 1828-1837
Non-Patent Document 2: C. Hallin et al., Diamond and Related Materials. 6 (1997), 1297-1300

SUMMARY OF THE INVENTION

Problems to be Solved by the Invention

However, in cases where a SiC wafer is irradiated (exposed) with ultraviolet light to detect an emission wavelength in the infrared region, it was found that the number of intrinsic defects detected varies because the light-emitting intensity of the substrate itself increases upon repeated irradiation with ultraviolet light. Consequently, the use of the SiC wafer itself as a reference sample used in managing the state of the photoluminescence device is problematic.

Therefore, the inventors arrived at the present invention by targeting the development of a reference sample that prevents changes in the substrate light-emitting intensity with repeated irradiation by excitation light from a photoluminescence device, enables an image equivalent to a basal plane dislocation (BPD) of the SiC wafer to be obtained even when irradiation of excitation light is performed under the same irradiation conditions as those of the defect measurement of the SiC wafer, enables a S/N ratio to be obtained which is sufficient for allowing automatic counting of the acquired image, and the like.

The present invention has been developed in light of the above problems, and has an object of providing a reference sample having a substrate light-emitting intensity that does not change with repeated irradiation by excitation light from a photoluminescence device, a SiC wafer defect measuring method that uses the reference sample, and a method of manufacturing a SiC epitaxial wafer.

Means for Solving the Problems

In order to solve the above problems, the present invention employs the following means.

(1) A SiC wafer defect measuring method according to a first aspect is a method of measuring defects in a SiC wafer using a photoluminescence device, the method comprising: a device management step of managing a defect measuring device by irradiating a reference sample which is made of a material having a light-emitting intensity that does not change with repeated irradiation by excitation light and which has a pattern made of recesses and/or protrusions in the surface, the irradiation by the excitation light being performed before measuring defects in a SiC wafer and under the same irradiation conditions as the measurement of the defects in the SiC wafer, and then measuring a S/N ratio of the pattern from a reflection image of the pattern.

(2) In the SiC wafer defect measuring method according to the aspect above, a plurality of patterns may be formed in the reference sample.

(3) In the SiC wafer defect measuring method according to the aspect above, the pattern may include a plurality of element patterns made of recesses and/or protrusions in the surface of the material.

(4) In the SiC wafer defect measuring method according to the aspect above, an aspect ratio between the depth and the length of the long side of the element pattern may be at least 0.04.

(5) In the SiC wafer defect measuring method according to the aspect above, the element pattern may have a rectangular shape.

(6) In the SiC wafer defect measuring method according to the aspect above, the length of the long side of the element pattern may be 100 μm or less.

(7) In the SiC wafer defect measuring method according to the aspect above, the length of the short side of the pattern formed in the reference sample may be front 5 to 50 μm in the reflection image, and the length of the long side may be at least 10 μm.

(8) In the SiC wafer defect measuring method according to the aspect above, the number density of patterns formed in the reference sample may be from 0.1 to 1000 patterns/cm$^2$.

(9) In the SiC wafer defect measuring method according to the aspect above, the number of patterns may be measured from the reflection image of the pattern by using the S/N ratio of the reflection image.

(10) In the SiC wafer defect measuring method according to the aspect above, the number of patterns may be measured automatically from the reflection image of the pattern.

(11) A reference sample according to a second aspect is used in a method for measuring defects in a SiC wafer using a photoluminescence device, wherein the reference sample may be made of a material having a light-emitting intensity that does not change with repeated irradiation by excitation light, and have a pattern made of recesses and/or protrusions in the surface.

(12) In the reference sample according to the aspect above, a plurality of patterns may be formed.

(13) In the reference sample according to the aspect above, the pattern may include a plurality of element patterns of recesses and/or protrusions in a surface of the material.

(14) In the reference sample according to the aspect above, an aspect ratio between the depth and the length of the long side of the element pattern may be at least 0.04.

(15) A method of manufacturing a SiC wafer according to the aspect above is a method of manufacturing a SiC epitaxial wafer that includes a device management step for managing a defect measuring device by irradiating a reference sample which is made of a material having a light-emitting intensity that does not change with repeated irradiation by excitation light and which has a plurality of patterns made of recesses and/or protrusions in the surface, the irradiation by the excitation light being performed before measuring defects in a SiC wafer and under the same irradiation conditions as the measurement of defects in the SiC wafer, and then measuring a S/N ratio of the pattern from a reflection image of the pattern.

Effects of the Invention

According to the present invention, a reference sample having a substrate light-emitting intensity that does not change with repeated irradiation by excitation light from a photoluminescence device can be provided.

According to the present invention, a SiC wafer defect measuring method capable of performing defect measurements using a photoluminescence device while maintaining a high state of accuracy can be provided.

According to the present invention, a method of manufacturing SiC epitaxial wafer that ensures the classification accuracy of defect types can be provided.

BRIEF DESCRIPTION OF THE DRAWINGS

FIG. 4 is made the recess, and the S/N ratio of the pattern.

EMBODIMENTS FOR CARRYING OUT THE INVENTION

The configurations of a SiC wafer defect measuring method, a reference sample, and a method of manufacturing a SiC epitaxial wafer to which the present invention is applied are described below with reference to the drawings. The drawings used in the description below may be drawn with specific portions enlarged as appropriate to facilitate comprehension of the features, and the dimensional ratios between the constituent elements may differ from the actual values. Further, the materials and dimensions and the like presented in the following examples are merely examples, which in no way limit the present invention, and may be altered as appropriate within a scope in which the effects of the present invention can be obtained.

(Reference Sample)

A reference sample according to an embodiment of the present invention is used in a method for measuring defects in a SiC wafer using a photoluminescence device, and is made of a material having a light-emitting intensity that does not change with repeated exposure to excitation light and which has a pattern made of recesses and/or protrusions in the surface.

Here, in the present specification, the "reference sample" is a sample for confirming whether or not a photoluminescence device used for inspecting defects in SiC wafers has a predetermined inspection accuracy.

The inventors have found that, in defect inspections of SiC wafers using a photoluminescence device, the noise in the luminance of the background increases with repeated irradiation of the SiC wafer by excitation light, resulting in a decrease in the S/N ratio. In this case, the inspection accuracy decreases. The result obtained from an inspection is only useful if the photoluminescence device is operating normally, and situations where, for example, the reason for a decrease in the defect number density is due to a reduction in the defect detection sensitivity caused by a malfunction in the photoluminescence device must be avoided. Therefore, it is necessary to confirm that the photoluminescence device is operating normally before measuring defects in the SiC wafer. However, because an increase in background noise with repeated irradiation by excitation light is problematic in substrates made of SiC, such substrates are unsuitable as reference samples.

Therefore, intensive investigations first focused on the fact that the magnitude of the luminance of the background does not increase for a Si (silicon) substrate even with repeated irradiation by excitation light. This is because, for the excitation light (ultraviolet light) used with respect to the SiC wafer, the light-emitting intensity of silicon is sufficiently low at the near infrared wavelength region at which the BPD emits light in the SiC wafer.

On the other hand, a low light-emitting intensity precludes use as a reference sample. However, it was found that, when the silicon substrate has a pattern made of recesses and/or protrusions in the surface and the surface is irradiated by excitation light under the same irradiation conditions as those used when measuring defects in the SiC wafer, an optical reflection image of the pattern can be obtained.

A reflection image in the present specification does not refer to an image of directly reflected excitation light but rather an image of the light that is returned from the reference sample as a result of irradiation with excitation light, and this light also contains luminescence light. In an actual photoluminescence measurement, a long pass filter is installed before the reflected light detector such that the reflected light having the wavelength used for the excitation itself is removed. A reflection image in the present specification refers to the light detected by such a photoluminescence device. Therefore, a concept was developed in which, by forming a pattern and measuring the S/N ratio of the pattern, it is possible to confirm that the photoluminescence device is operating normally before measuring defects in the SiC wafer.

The material of the reference sample is not particularly limited as long as the light-emitting intensity does not change with repeated irradiation by excitation light, and materials such as silicon and germanium and the like can be used. Further, compound semiconductors such as GaAs and GaInAs that emit luminescence light in the infrared region and do not have the characteristic wherein the light-emitting intensity changes with repeated irradiation by excitation light can also be used.

Figure 1:
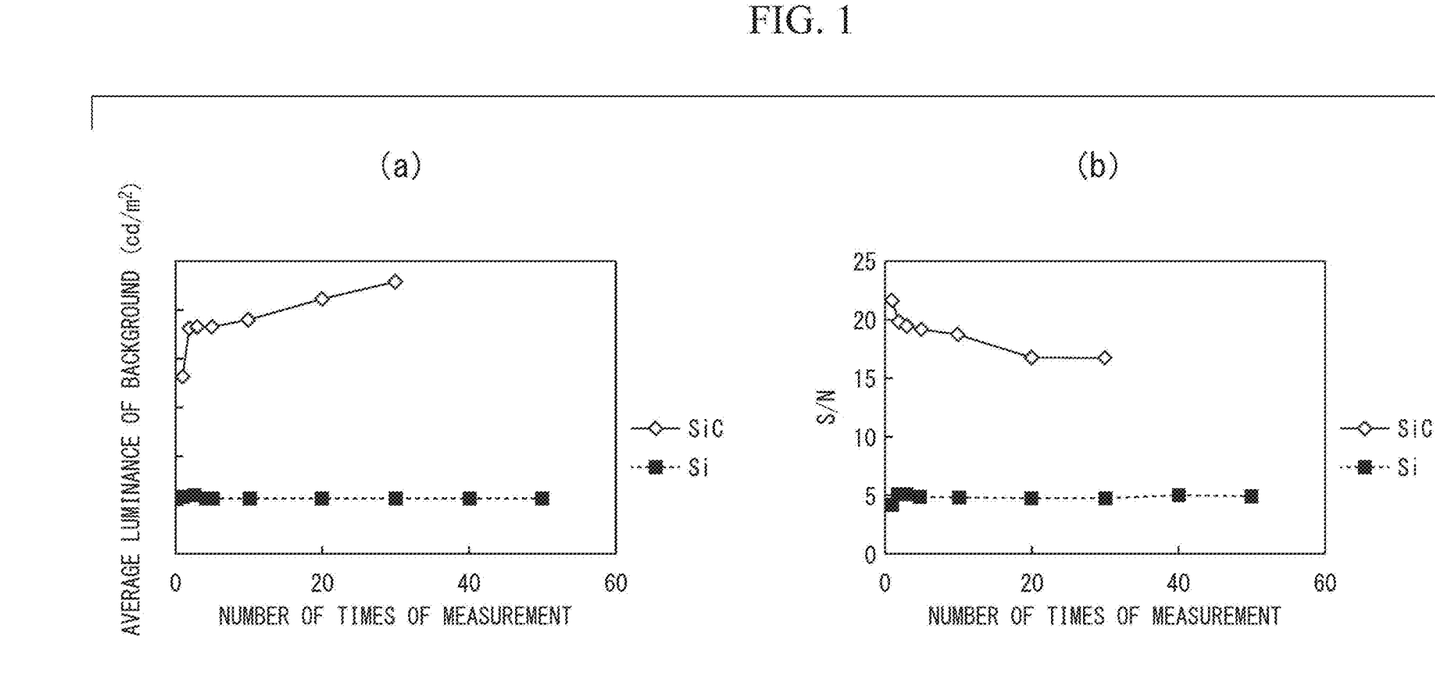
FIG. 1 shows graphs, wherein (a) is a graph showing the relationship between the number of times of irradiation and the luminance of the background when a SiC epitaxial wafer and a silicon substrate are each repeatedly irradiated by excitation light, and (b) is a graph showing the relationship between the number of times of irradiation and the S/N ratio.

(a) of FIG. 1 shows the luminance of the background when a SiC epitaxial wafer and a silicon substrate are each repeatedly irradiated by excitation light. The horizontal axis represents the number of times of the irradiation (measurement frequency) and the vertical axis represents the luminance of the background ($cd/m^2$). Here, the luminance of the background refers to the luminance associated with a conventional part in which the pattern in the reference sample has not been formed.

The luminance of the background is obtained using a photoluminescence device (SIC A87 manufactured by Lasertec Corporation), with each irradiation performed for 45 msec using an excitation light having a wavelength of 313 nm. That is to say, irradiation was performed for 45 msec/cycle. The excitation wavelength used may be any wavelength capable of achieving excitation of SiC such as 250 to 400 nm. Because the penetration length into SiC differs depending on the excitation wavelength, the wavelength may be freely selected depending on the depth to be observed.

The luminance of the background represents the luminance of the background in the PL image obtained at the light-receiving wavelength of a light-receiving filter (long pass filter (660 nm)). The luminance of the background represented by the vertical axis is an average value of the luminance of the background of a roughly 0.5 mm×0.5 mm defect-free region.

As was the case in (a) of FIG. 1, the horizontal axis in (b) of FIG. 1 is the number of times of irradiation (measurement frequency), while the vertical axis is the S/N. In (b) of FIG. 1, Si uses a reference sample in which a predetermined pattern according to the present embodiment is formed. The pattern of this reference sample has seven vertically arranged patterns, each of which is equivalent to the pattern shown in (a) of FIG. 3 described below.

Figure 2:
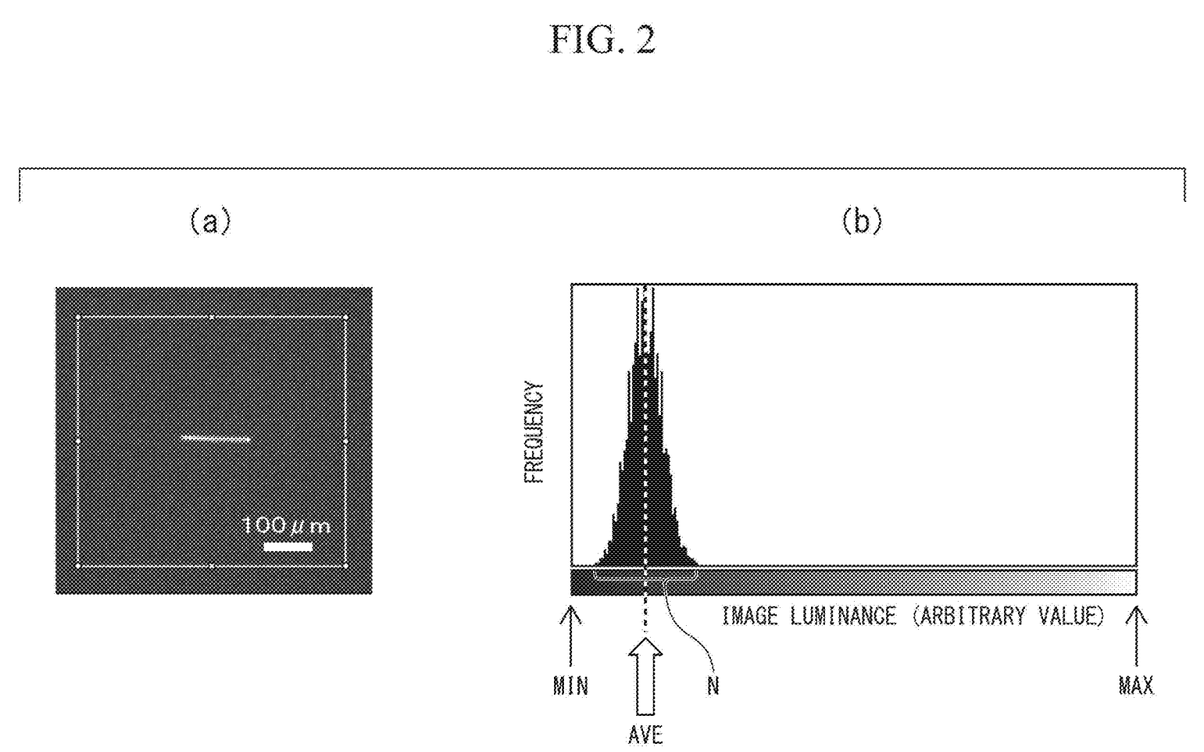
FIG. 2 is a conceptual diagram of a S/N calculation, where (a) indicates the region in the photoluminescence (PL) image containing a BPD in which a S/N calculation was performed with a frame, and (b) is a histogram showing the luminance of each pixel in the region in which the S/N calculation was carried out.

FIG. 2 is a conceptual diagram of a S/N calculation, (a) of FIG. 2 is a PL image containing a BPD, and (b) of FIG. 2 is a histogram showing the luminance of each pixel in the region enclosed by the frame in the image. The left end of the horizontal axis in (b) of FIG. 2 represents the minimum luminance (MIN), and the right end represents the maximum luminance (MAX). The dotted line in (b) of FIG. 2 represents the average luminance (AVE) of the background. Here, the "N" in S/N is the standard deviation value of the luminance of the background, while "S" is a value obtained by calculating "maximum luminance−average luminance of background" in the roughly 0.5 mm×0.5 mm region containing the basal plane dislocation (BPD). Further, when the pattern of the reference sample is viewed, the pattern is regarded as a basal plane dislocation and measured in an equivalent manner.

As shown in (a) of FIG. 1, the luminance of the background of the SiC epitaxial wafer rises as the number of times of the measurement increases. In contrast, in a silicon substrate, the luminance of the background does not change even when the number of times of the measurement increases. As a result, as shown in (b) of FIG. 1, the S/N decreases in a SiC epitaxial wafer as the number of times of the measurement increases, and the S/N does not change in a silicon substrate even when the number of times of the measurement increases.

Figure 3:
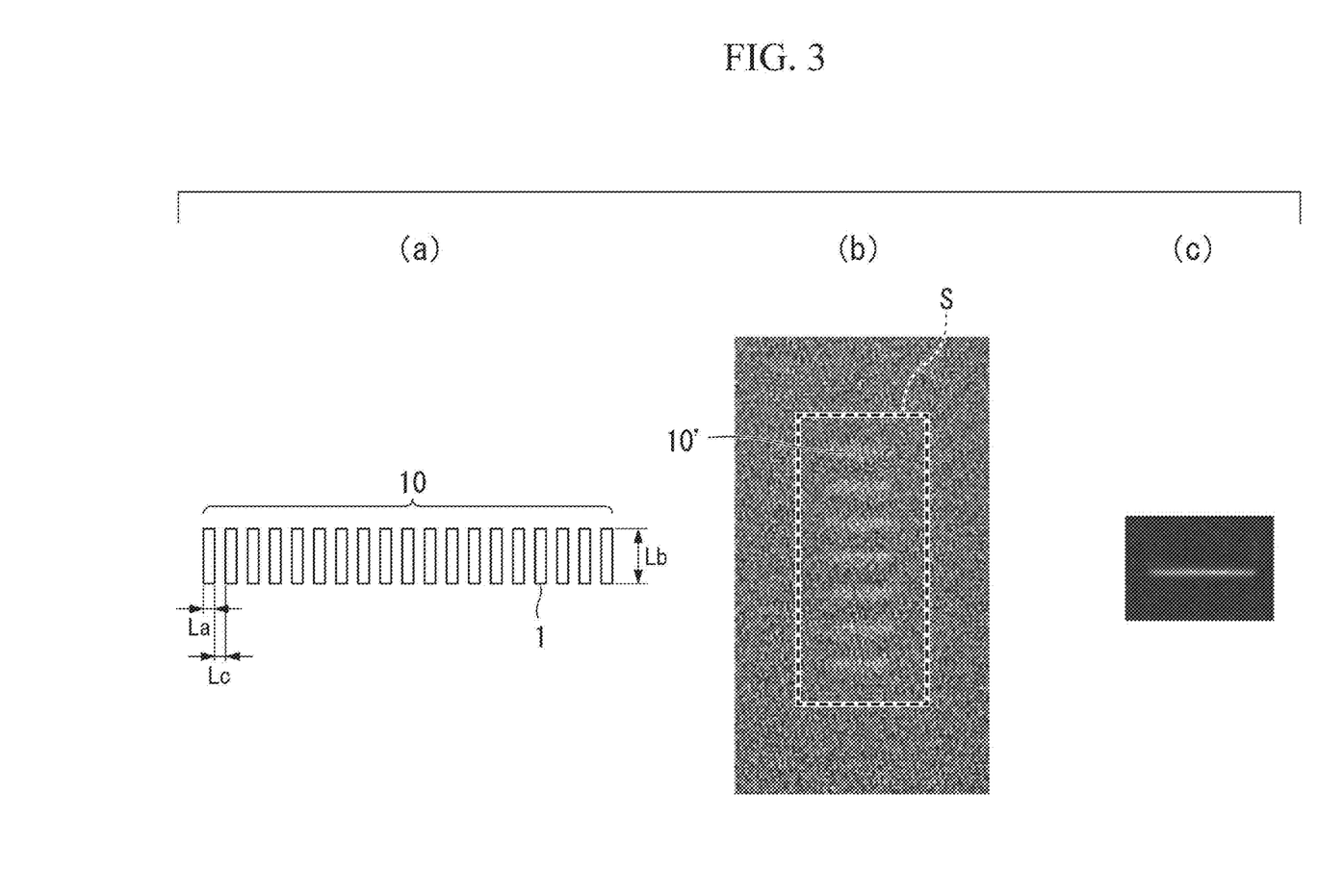
FIG. 3 shows views wherein (a) is a schematic plan view showing one example of a single pattern constituted by a plurality of element patterns, (b) shown in FIG. 3 is an optical reflection image actually obtained from a measurement point in which seven of the patterns in (a) were arranged in parallel in the vertical direction, and (c) shown in FIG. 3 is a PL image of a basal plane dislocation having approximately the same size as the pattern shown in (b).

(a) of FIG. 3 is a schematic plan view showing of one example of a pattern. The pattern 10 shown in (a) of FIG. 3 has a plurality of element patterns 1.

The element pattern 1 has a rectangular structure in plan view wherein the short axis direction length (La) and the long axis direction length (Lb) are respectively 2 μm and 10 μm. The pattern 10 consists of 19 element patterns 1 separated by an equal distance (Lc) of 2 μm. The number of element patterns 1 in the pattern 10 may be, but is in no way limited to, 2 to 100.

(b) of FIG. 3 shows a reflection image S obtained from a reference sample having seven of the patterns 10 shown in (a) of FIG. 3 arranged vertically and formed with a depth of 1,000 nm in a silicon substrate, and the image obtained following irradiation for 45 msec with an excitation light having a wavelength of 313 nm using a photoluminescence device (SIC A87 manufactured by Lasertec Corporation).

The S/N of each pattern in the reflection image is 4 to 5. As shown in (b) of FIG. 3, the pattern 10 formed in the wafer is clearly visible as a pattern 10' in the reflection image S.

The pattern 10 formed in the reference sample preferably adopts a rectangular (oblong) pattern 10' in the reflection image S. The length of the short side is preferably from 5 to 50 nm, and more preferably from 10 to 20 μm. Further, the length of the long side is preferably at least 10 μm but not more than 2,500 μm, and is more preferably from 50 to 1,000 μm. Because defects in epitaxial SiC have a variety of different sizes depending on the epitaxial layer thickness and the like, it is desirable to set the length of the long side according to the size of the defects targeted for measurement.

The pattern 10' observed in the reflection image (reflection image S) by an optical microscope differs from the pattern 10 formed in the wafer. The element patterns 1 are unable to be distinguished in the optical reflection image, and the collective reflection image from the element patterns 1 is recognized as a single pattern 10'. The rectangular shape in the reflection image S may be an approximate rectangular shape (oblong), and limitations are not placed on the rounding of the corners. The size of the pattern 10' in the reflection image S from the optical microscope is preferably about the same size as the short side of the PL image (approximately rectangular) of the basal plane dislocation (BPD).

Further, the pattern 10' in the optical microscope may also be regulated by the size of the pattern 10 formed in the reference sample. The size of the pattern 10 may be defined by the size of a minimum rectangle (square or oblong) drawn so as to enclose the pattern 10 in plan view. Therefore, the lengths correspond to the short axis length and the long axis length (or the length of one side×the length of one side in the case of a square).

The pattern 10' in the optical microscope corresponding the pattern 10 defined in this manner has roughly the same size as the optical reflection image of the pattern 10. Therefore, the size of the pattern 10 may be set to have a short side of 5 to 50 μm, and preferably 10 to 20 μm. Further, the length of the long side of pattern 10 may be set to 10 to 2,500 μm, and preferably 50 to 1,000 μm.

The distance between element patterns 1 is preferably arranged sufficiently close so as to enable the measurement device to recognize the reflection image S of the pattern 10 as a single pattern 10'. Although the required distance changes according to the magnification and the settings of the determination program of the measurement device, for example, a distance between the element patterns 1 of about 20 μm or less enables discrimination and recognition as a single pattern. The distance between the element patterns 1 may be, but is in no way limited to, at least 0.5 μm.

(c) of FIG. 3 is a PL image of a basal plane dislocation (BPD) having about same size as the pattern 10' shown in (b) of FIG. 3. The S/N of this PL image when first measured was 10 to 35.

The pattern 10 formed in the reference sample may take various forms in addition to those shown in FIG. 3. The pattern 10 formed in the reference sample is not particularly limited as long as the number of patterns 10' can be measured from the reflection image S by irradiation with excitation light before measurement of defects in the SiC wafer and under the same irradiation conditions as the measurement, and preferred examples includes a pattern in which the long side of the rectangular shape of the pattern is short.

An experiment was performed whereby the shape of the pattern formed in the surface of the reference sample and the S/N ratio (contrast) of the reflection image of the pattern were compared.

Figure 4:
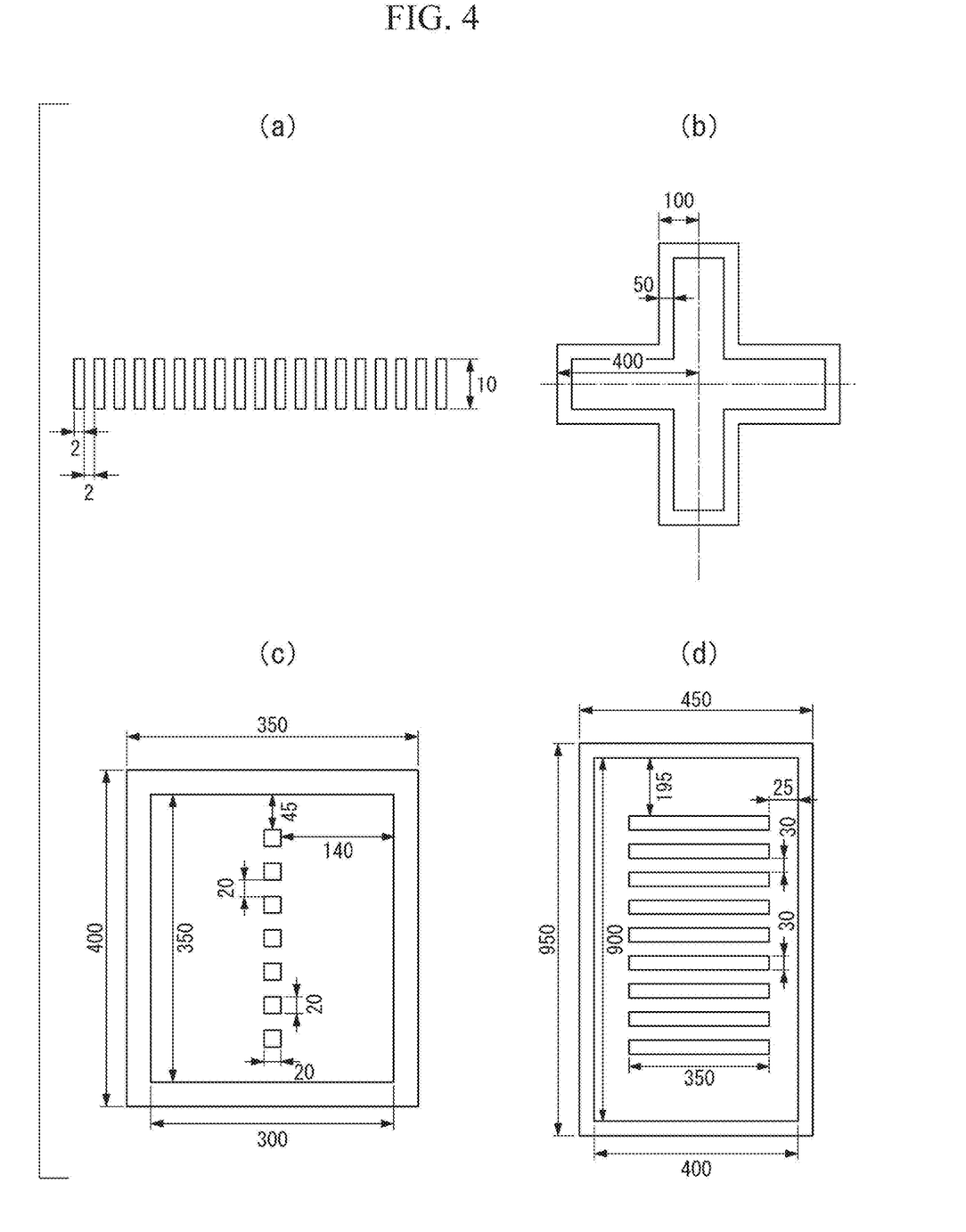
FIG. 4 is a schematic diagram showing examples of patterns according to the present embodiment.

FIG. 4 shows examples of the patterns that used. The numbers shown in the diagram represent distances (lengths) in units of μm. (a) of FIG. 4 is a pattern in which 19 rectangular element patterns are arranged with equal spacings along the direction of the short side. (b) of FIG. 4 is a pattern in which 50 μm-wide recesses are formed along the outline of a cross shape. (c) and (d) of FIG. 4 are patterns used as stepper markers respectively referred to as FIA and LSA patterns. (c) and (d) of FIG. 4 have recesses in an outer rectangular section and in small square-shaped sections inside the region enclosed by the rectangular shape.

Table 1 presents the S/N values for the reflection images obtained after irradiating silicon substrate reference samples having the patterns shown in (a) to (d) of FIG. 4 with a marking depth of 1,000 nm, the images being obtained following irradiation for 95 msec with an excitation light having a wavelength of 313 nm using a photoluminescence device (SIC A87 manufactured by Lasertec Corporation). The reflection images were measured by installing a light-receiving filter (long pass filter (660 nm)) to the light-receiving unit.

TABLE 1

| Pattern | S/N Ratio |
| --- | --- |
| (a) of FIG. 4 | 6.1 |
| (b) of FIG. 4 | 4.0 |

TABLE 1-continued

| Pattern | S/N Ratio |
| --- | --- |
| (c) of FIG. 4 | 4.6 |
| (d) of FIG. 4 | 3.2 |

Figure 5:
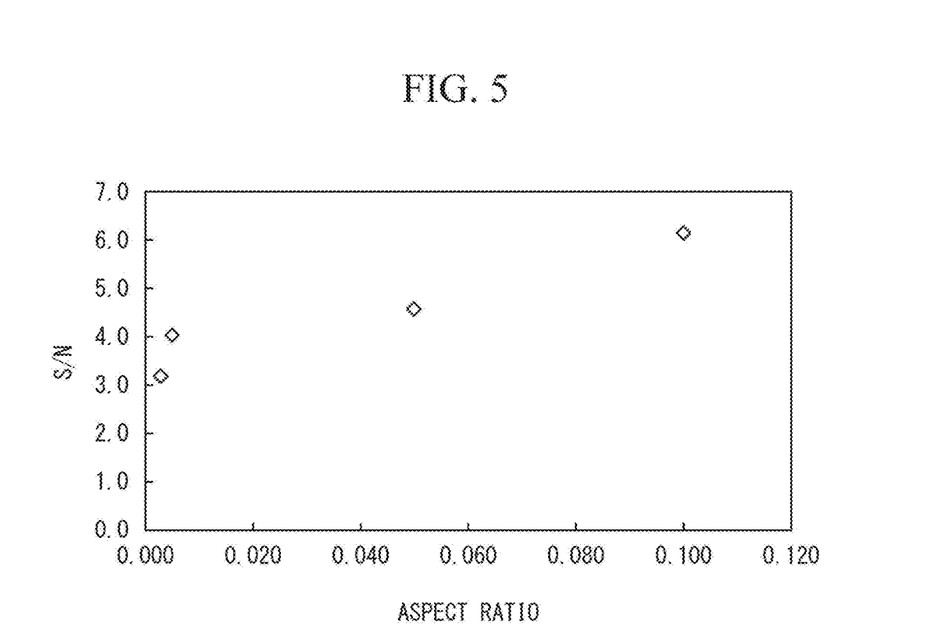
FIG. 5 is a graph showing the relationship between the aspect ratio (depth/length of long side of rectangle) between the depth and the length of the long side of a rectangular element pattern when the smallest area section in the rectangular element pattern shown

The S/N ratio showed a tendency to become larger as the depth of the section having the smallest area in the rectangular shape constituting the pattern was increased, and as the length of the long side of the aperture of the rectangular shape was made shorter. FIG. 5 shows the relationship between the aspect ratio between the length and depth of the long side of the aperture, and the S/N ratio. As shown in FIG. 5, the S/N ratio becomes large when the aspect ratio is at least 0.04.

The reason for being able to obtain contrast corresponding to the pattern from a silicon wafer in which a pattern is formed is considered to be a result of local changes in the emission efficiency of the photoluminescence light due from the recesses and protrusions of the pattern.

Consequently, the S/N ratio is considered to change according to the aspect ratio, and the shape of the pattern is important for obtaining a large S/N ratio. Further, because the recesses and protrusions in the pattern provide a large contribution toward the contrast, a smaller pattern forming the recesses and protrusions is considered to be advantageous for obtaining a large S/N ratio. In the SiC wafer defect measuring method according to the present embodiment, a large S/N ratio can be obtained by configuring the pattern to have smaller element patterns. As a result, a contrast image that can be applied as a photoluminescence reference sample can be easily obtained.

The S/N ratio is at least a magnitude that enables discrimination of patterns in the reflection image. However, if the S/N ratio is low, the accuracy decreases due to noise, or a long time is needed for statistical processing of the signal. Consequently, a high S/N ratio is desirable. The S/N ratio obtained from the pattern is preferably at least 4.0.

The length of the long side of the element pattern is preferably set such that the S/N ratio becomes 4.0. The length of the long side of the element pattern is preferably 100 μm or less, and preferably at least 5 μm. Further, this length is more preferably from 10 to 25 μm. If the element pattern is not rectangular, the section having a maximum length across the recesses and protrusions may be regarded as the long side.

The shape of the pattern and the element pattern is not particularly limited as long as it enables the required S/N ratio to be obtained. As shown in (a) of FIG. 4, rectangular element structures having the same size may be linearly arranged. It is not necessary for the size of the element structures to be the same, and the structures may adopt a structure such that a portion of the element structure has a high S/N ratio. Further, the shape of the element structure is not limited to a rectangular shape, and may be an arbitrary shape that possesses an aspect ratio having a high S/N ratio.

(SiC Wafer Defect Measuring Method)

The SiC wafer defect measuring method according to an embodiment of the present invention includes a device management step for managing a defect measuring device by irradiating a reference sample which is made of a material having a light-emitting intensity that does not change with repeated irradiation by excitation light and which has a plurality of patterns made of recesses and/or protrusions in the surface, the irradiation by the excitation light being performed before measuring defects in a SiC wafer and under the same irradiation conditions as the measurement, and then measuring the S/N ratio of the pattern from a reflection image of the pattern. Here, the "SiC wafer" includes both a single crystal substrate (wafer) before epitaxial growth and a SiC epitaxial wafer having an epitaxial film on the substrate.

As described above, the reference sample used in the SiC wafer defect measuring method of the present invention preferably provides a reflection image of the formed pattern having a short side length of 5 to 50 μm, and a long side length of at least 10 μm.

Further, the reference sample used in the SiC wafer defect measuring method of the present invention preferably has a number density of patterns formed in the reference sample of 0.1 to 1,000 patterns/cm². Here, the number density indicates the density in which a pattern 10 such as that shown in (a) of FIG. 3 is present within a predetermined region of the reference sample.

In the SiC wafer defect measuring method using the reference sample, in addition to the S/N ratio of the detected pattern, the number of detected patterns can also be used to determine whether or not the photoluminescence device is operating normally. For example, normal operation may be defined solely as a case where the number of detected patterns matches the number of patterns actually formed in the reference sample, or normal operation may be freely defined as the number of patterns being within a range of 1σ (σ: standard deviation) and the like.

The reference sample used in the SiC wafer defect measuring method according to the present embodiment may use the S/N ratio of the reflection image and measure the number of patterns from the reflection image of the patterns.

The reference sample the used SiC wafer defect measuring method according to the present invention may automatically measure the number of patterns from the reflection image of the patterns. The measurement of the patterns may use a method that pre-stores the patterns in a computer and automatically counts any shapes that are close to that of the stored pattern when measuring the reference sample.

Figure 6:
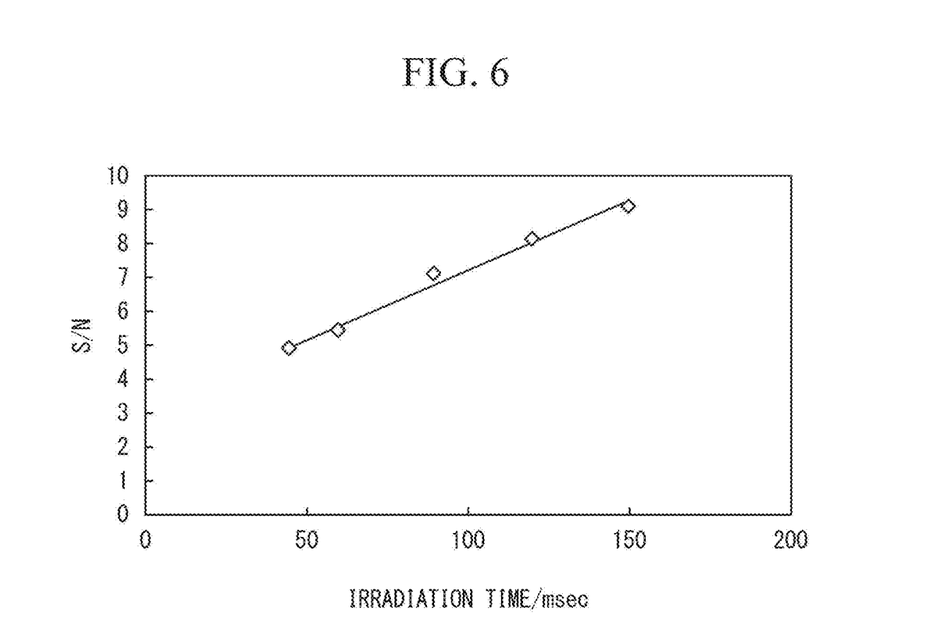
FIG. 6 is a graph showing the relationship between the irradiation time and the S/N ratio when a silicon substrate having the pattern (depth: 1,000 nm) shown in (a) of FIG. 3 formed in the surface is exposed to excitation light having a wavelength of 313 nm.

FIG. 6 shows the relationship between the irradiation time and the S/N ratio when a silicon substrate having a plurality of patterns (depth: 1,000 nm) shown in (a) of FIG. 3 formed in the surface is irradiated with an excitation light having a wavelength of 313 nm using a photoluminescence device (SIC A87 manufactured by Lasertec Corporation).

From FIG. 6, it can be seen that a S/N ratio of at least 5 can be obtained when the irradiation time is at least 50 msec.

Figure 7:
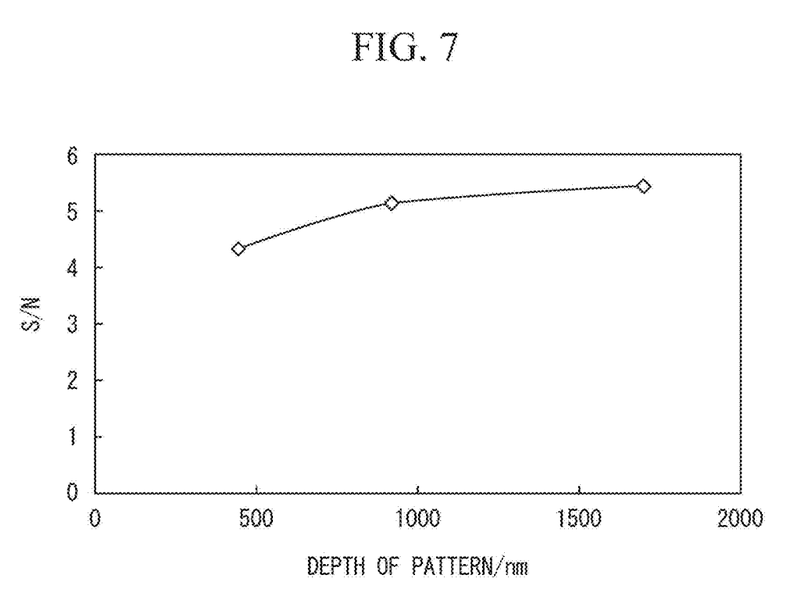
FIG. 7 shows the relationship between the pattern depth and the S/N ratio when a silicon substrate having the pattern shown in (a) of FIG. 3 formed in the surface is exposed to excitation light having a wavelength of 313 nm.

FIG. 7 shows the relationship between the pattern depth and the S/N ratio when a silicon substrate having the pattern shown in (a) of FIG. 3 formed in the surface is irradiated for 90 msec with an excitation light having a wavelength of 313 nm using a photoluminescence device (SIC A87 manufactured by Lasertec Corporation).

From FIG. 7, it can be seen that a S/N ratio of at least 4 is obtained if the depth is at least 400 nm, and further, a S/N ratio of at least 5 is obtained if the depth is at least 1000 nm.

(Method of Manufacturing SiC Epitaxial Wafer)

The method of manufacturing a SiC epitaxial wafer according to an embodiment of the present invention includes a device management step for managing a defect measuring device by irradiating a reference sample which is made of a material having a light-emitting intensity that does not change with repeated irradiation by excitation light and which has a plurality of patterns made of recesses and/or protrusions in the surface, the irradiation by the excitation light being performed before measuring defects in a SiC wafer and under the same irradiation conditions as the measurement, and then measuring the S/N ratio of the pattern from a reflection image of the pattern.

In the manufacturing steps for a SiC epitaxial wafer, the defect density is measured by a defect measuring device using photoluminescence. The classification accuracy of defect types is ensured by providing the device management step. When the count value of the measured defect density is high, the wafer is judged as defective and excluded from the final product. The measured defects are classified, and judgments are performed for each classification. Further, then the number of measured defects increases, this is used to probe the cause of the defects and can be reflected in corrections to the epitaxial growth with conditions and the like.

In the method of manufacturing a SiC epitaxial wafer according to the present embodiment, known processes can be used for steps other than the device management step.

INDUSTRIAL APPLICABILITY

According to the present invention, a reference sample having a substrate light-emitting intensity that does not change with repeated irradiation by excitation light from a photoluminescence device can be provided. Further, according the present invention, a SiC wafer defect measuring method capable of performing defect measurements using a photoluminescence device maintaining a high state of accuracy can be performed using the reference sample described above. According to the method of manufacturing a SiC epitaxial wafer of the present invention, the classification accuracy of defect types can be ensured.

DESCRIPTION OF THE REFERENCE SIGNS

1: Element pattern
10: Pattern
10': Pattern in reflection image
S: Reflection image

The invention claimed is:

1. A SiC wafer defect measuring method of measuring defects in a SiC wafer using a photoluminescence device, the method comprising:
 a device management step of managing a defect measuring device by irradiating a reference sample which is made of a material having a light-emitting intensity that does not change with repeated irradiation by excitation light and which has a pattern made of recesses and/or protrusions in a surface thereof, the irradiation by the excitation light being performed before measuring defects in a SiC wafer and under the same irradiation conditions as the measurement of the defects in the SiC wafer, and then measuring a S/N ratio of the pattern from a reflection image of the pattern.

2. The SiC wafer defect measuring method according to claim 1, wherein a plurality of the patterns are formed in the reference sample.

3. The SiC wafer defect measuring method according to claim 2, wherein a number density of patterns formed in the reference sample is from 0.1 to 1000 patterns/cm$^2$.

4. The SiC wafer defect measuring method according to claim 2, wherein a number of patterns is measured from a reflection image of the pattern by using a S/N ratio of the reflection image.

5. The SiC wafer defect measuring method according to claim 2, wherein a number of patterns is measured automatically from a reflection image of the pattern.

6. The SiC wafer defect measuring method according to claim 1, wherein the pattern includes a plurality of element patterns made of recesses and/or protrusions in a surface of the material.

7. The SiC wafer defect measuring method according to claim 6, wherein an aspect ratio between a depth and a length of a long side of the element pattern is at least 0.04.

8. The SiC wafer defect measuring method according to claim 6, wherein the element pattern has a rectangular shape.

9. The SiC wafer defect measuring method according to claim 6, wherein a length of a long side of the element pattern is 100 μm or less.

10. The SiC wafer defect measuring method according to claim 1, wherein a length of a short side of a pattern formed in the reference sample is from 5 to 50 μm in the reflection image, and a length of a long side is at least 10 μm.

11. A reference sample used in a method of measuring defects in a SiC wafer using a photoluminescence device,
 wherein the reference sample is made of a material having a light-emitting intensity that does not change with repeated irradiation by excitation light, and has a pattern made of recesses and/or protrusions in a surface thereof,
 wherein the pattern includes a plurality of element patterns made of recesses and/or protrusions in a surface of the material, and
 wherein an aspect ratio between a depth and a length of a long side of the element pattern is at least 0.04.

12. The reference sample according to claim 11, wherein a plurality of the patterns are formed.

13. A method of manufacturing a SiC epitaxial wafer, the method comprising:
 a device management step of managing a defect measuring device by irradiating a reference sample which is made of a material having a light-emitting intensity that does not change with repeated irradiation by excitation light and which has a plurality of patterns made of recesses and/or protrusions in a surface thereof, the irradiation by the excitation light being performed before measuring defects in a SiC wafer and under the same irradiation conditions as the measurement of the defects in the SiC wafer, and then measuring a S/N ratio of the pattern from a reflection image of the pattern.

* * * * *